United States Patent [19]

Merkel

[11] Patent Number: 5,026,989

[45] Date of Patent: Jun. 25, 1991

[54] SYSTEM FOR MONITORING MATERIAL DISPENSED ONTO A SUBSTRATE

[75] Inventor: Stephen L. Merkel, Bay Village, Ohio

[73] Assignee: Nordson Corporation, Westlake, Ohio

[21] Appl. No.: 163,158

[22] Filed: Feb. 25, 1988

Related U.S. Application Data

[63] Continuation of Ser. No. 785,332, Oct. 7, 1985, abandoned.

[51] Int. Cl.$^5$ ............................................. G01N 21/86
[52] U.S. Cl. ................................. 250/338.1; 307/494
[58] Field of Search ...................... 307/494; 250/338.1

[56] References Cited

U.S. PATENT DOCUMENTS

| | | |
|---|---|---|
| 3,067,646 | 12/1962 | Reesen .................. 356/430 |
| 3,380,431 | 4/1968 | Keyes et al. .......... 118/670 |
| 3,410,008 | 11/1968 | Coombes et al. . |
| 3,482,781 | 12/1969 | Sharpe . |
| 3,816,025 | 6/1974 | O'Neill . |
| 3,818,335 | 6/1974 | Stungis et al. . |
| 3,855,489 | 12/1974 | Striker et al. . |
| 3,976,989 | 8/1976 | Smith . |
| 4,019,653 | 4/1977 | Scherer et al. . |
| 4,023,020 | 5/1977 | Lestradet . |
| 4,063,824 | 12/1977 | Baker et al. . |
| 4,072,934 | 2/1978 | Hiller et al. . |
| 4,149,254 | 4/1979 | Molusis . |
| 4,188,624 | 2/1980 | Hochsprung et al. . |
| 4,251,566 | 1/1981 | Gingerich . |
| 4,315,317 | 2/1982 | Orchard et al. . |
| 4,389,969 | 6/1983 | Johnson . |
| 4,430,886 | 2/1984 | Rood . |
| 4,498,415 | 2/1985 | Tsuchiya et al. . |
| 4,613,059 | 9/1986 | Merkel ................... 222/52 |
| 4,668,948 | 6/1987 | Merkel ................ 340/825.3 |
| 4,831,258 | 5/1989 | Paulk et al. ............ 250/349 |
| 4,978,872 | 12/1990 | Morse et al. ........... 307/490 |

FOREIGN PATENT DOCUMENTS

| | | |
|---|---|---|
| 0154441 | 9/1985 | European Pat. Off. . |
| 2201763 | 4/1974 | France . |
| 54-119282 | 9/1979 | Japan ...................... 250/338.1 |
| 55-164316 | 12/1980 | Japan . |
| 60-12155 | 1/1985 | Japan . |
| 1-277724 | 11/1989 | Japan ...................... 250/338.1 |
| 1128386 | 12/1984 | U.S.S.R. .................. 307/494 |

OTHER PUBLICATIONS

Eltec Publication 815/815B Ir-Eye Sensing Monitor (11 pages).
Paul Horowitz and Winfield Hill, The Art of Electronics, (Cambridge, Cambridge University Press, 1980) p. 95.
Exergen Corporation Literature (14 pages).

Primary Examiner—Constantine Hannaher
Attorney, Agent, or Firm—Wood, Herron & Evans

[57] ABSTRACT

A system for monitoring energy radiant from a material dispensed onto a substrate. As disclosed, an infrared sensor is positioned to receive infrared energy radiated by a substrate and by a heated adhesive applied to the substrate, with the resistance of the sensor varying in dependence upon the amount of infrared energy received. An amplifier has an input capacitively coupled to the sensor, and the voltage at the amplifier input varies in dependence upon the resistance of the sensor. The output voltage of the amplifier varies in dependence upon the amplifier input voltage, and hence upon the amount of infrared energy reaching the sensor. In order to prevent inaccuracies in the amplifier output signal due to, for example, temperature-related resistance variations of the sensor, the amplifier input is grounded during intervals when the sensor receives infrared energy from the substrate and ungrounded shortly before the sensor begins to receive infrared energy from the heated adhesive.

23 Claims, 1 Drawing Sheet

SYSTEM FOR MONITORING MATERIAL DISPENSED ONTO A SUBSTRATE

This application is a continuation, of application Ser. No. 785,332, filed Oct. 7, 1985, now abandoned.

DESCRIPTION OF THE INVENTION

This invention relates generally to arrangements for dispensing a material onto a substrate, and more particularly concerns a system in such an arrangement for monitoring energy radiant from a material dispensed onto a substrate.

In applying coating materials such as paints and adhesives to substrates, it is often important to monitor the material to ensure that it has been suitably applied. Applied materials can be monitored visually, or through the use of various types of sensors, such as capacitive or magnetic sensors, sensors monitoring reflected light, and other types of sensors.

In some applications sensors are employed which monitor energy radiant from the material applied to the substrate. For example, in the case of dispensing a heated adhesive bead onto a substrate, an infrared sensor can be employed to monitor the applied adhesive. Such an infrared sensor typically exhibits a resistance which is dependent upon the intensity of received infrared radiation, within an energy band to which the sensor is sensitive. The sensor is usually connected in a bridge or voltage divider circuit in which resistance changes in the sensor are converted to voltage variations, which are in turn amplified to provide an output signal indicative of the level of infrared radiation from the adhesive bead. This infrared radiation level is a composite indication of the size of the adhesive bead and its temperature.

In the case of a continuously applied bead of heated adhesive, the sensor can be positioned near the adhesive dispenser, slightly downstream therefrom, and the electrical output signal of the associated circuit monitored to assure that the infrared radiation from the adhesive bead falls within an acceptable range.

A difficulty arises in such systems in that significant resistance variations of the infrared sensor are produced by variations in the ambient temperature at the sensor location. These resistance variations prevent accurately monitoring the received infrared radiation as an adhesive bead passes the sensor.

It is consequently a general aim of the present invention to provide a system for monitoring energy radiant from a material dispensed onto a substrate which overcomes the above-described difficulty of sensor sensitivity to ambient conditions.

In one form of the invention, a material monitoring system includes a sensor positioned to receive radiant energy from a material dispensed onto a substrate wherein the sensor has an electrical characteristic whose value varies in dependence upon the amount of energy received by the sensor.

The material is dispensed onto a substrate moving relative to a dispensing gun to form one or more beads of material on the substrate. The sensor is physically mounted near the dispensing gun, downstream along the bead path. The sensor is capacitively coupled to the input of an amplifier which is operable to produce at an output an output signal which varies in dependence upon the value of the electrical characteristic of the sensor.

The material dispensed onto the substrate may be in the form of, for example, several discrete beads of material with intervals of exposed substrate between the beads. In this case, the sensor receives radiant energy from the material as the beads of material pass the sensor and from the substrate, during the intervals between the beads of material. In some cases a continuous closed loop of material is applied to a substrate. In such a case, at the beginning of application of the bead of material to the substrate, the sensor receives radiation from the exposed substrate since the sensor is downstream from the dispensing gun and there is a delay in movement of the beginning of the bead of material from the gun to the sensor.

In order to eliminate the above-mentioned difficulties of the temperature dependence of the sensor, the input of the amplifier in the monitoring system is clamped to a particular voltage level, such as ground, during intervals when the sensor is receiving radiant energy from the substrate. The amplifier input is then unclamped shortly before a bead of material reaches the sensor. Since the sensor voltage is capacitively coupled to the amplifier input, only changes in sensor voltage will be coupled to the amplifier. Therefore, the amplifier will note the change in the sensor voltage due to the difference between the radiant energy received from the substrate and the radiant energy received from the bead of material applied to the substrate.

In the form of monitoring system illustrated herein, the amplifier input is grounded by a field effect transistor which is gated on during intervals between applied beads of a heated adhesive material. Based upon a control signal which controls the adhesive dispenser, the field effect transistor receives a gating signal which turns off the transistor shortly before an adhesive bead reaches the sensor so that the sensor is capacitively coupled to the input of the amplifier shortly before, and then during, the time that an adhesive bead passes the sensor. If a series of adhesive beads are applied to a single substrate, the amplifier input is clamped to ground and unclamped during each interval between adhesive beads at the sensor location. If a single adhesive bead is applied to a substrate, the amplifier input is clamped to ground and unclamped before the beginning of the adhesive bead reaches the sensor location. In cases in which the temperature of the sensor is relatively stable, it would be possible to clamp and unclamp the amplifier input less frequently, such as during every other interval between adhesive beads.

The infrared sensor is connected in series in a resistance string to which a voltage is applied, and a voltage in this resistance divider string which is proportional to the resistance of the sensor, and hence to the amount of received infrared radiation, is capacitively coupled to the amplifier input. The voltage coupled to the amplifier input increases if the sensed infrared energy increases, and in the normal case, the sensor receives more infrared energy from the heated adhesive bead than from the substrate.

When the amplifier input is unclamped from ground, while the sensor is receiving infrared radiation from the substrate, the voltage at the amplifier input stays at a ground potential due to the capacitor (which is a relatively high value, low leakage capacitor) interposed between the sensor voltage and the amplifier input. When the heated adhesive bead moves into the sensitive zone of the infrared sensor, in the normal situation the sensed infrared radiation increases and thus the sensor voltage increases. Due to the capacitive coupling, only the increase in voltage is coupled to the amplifier input and amplified by the amplifier.

Therefore, a zero reference for the sensor is established based upon the radiation of the substrate prior to each time that an adhesive bead is monitored. Assuming that the sensor temperature does not change over the length of a monitored bead of adhesive, which is a very accurate assumption for typical adhesive bead lengths, reliable infrared radiation information concerning the adhesive bead is obtained due to the consistency of the substrate in providing a reference infrared radiation level.

Further objects and advantages of the invention, and the manner of their implementation, shall become apparent upon reading the following detailed description and upon reference to the drawings, in which.

Figure 1:
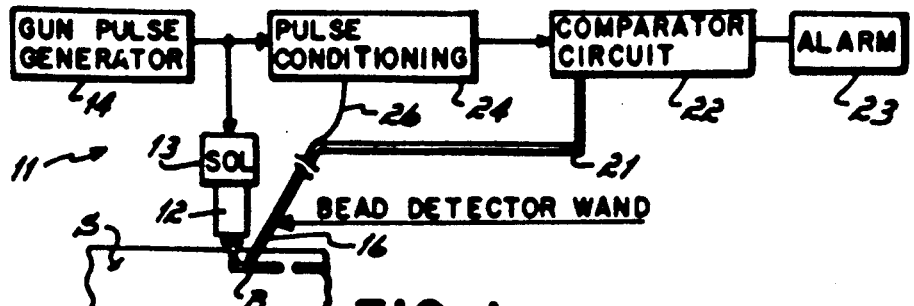
FIG. 1 is a diagrammatic illustration of an adhesive bead dispensing arrangement including a monitoring system in accordance with the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention as defined by the appended claims.

Turning now to the drawings, a heated adhesive dispensing arrangement 11 includes a dispenser 12 for a heated adhesive, such as a heated weldable sealant. The dispenser 12 includes a valve (not shown) controlled by a solenoid 13 to dispense adhesive onto a substrate S. Adhesive is dispensed when the valve is open and prevented from flowing from the dispenser 12 when the valve is closed. A gun pulse generator 14 produces positive pulses which are coupled to the solenoid 13 to open the valve so that adhesive is dispensed.

Figure 4:
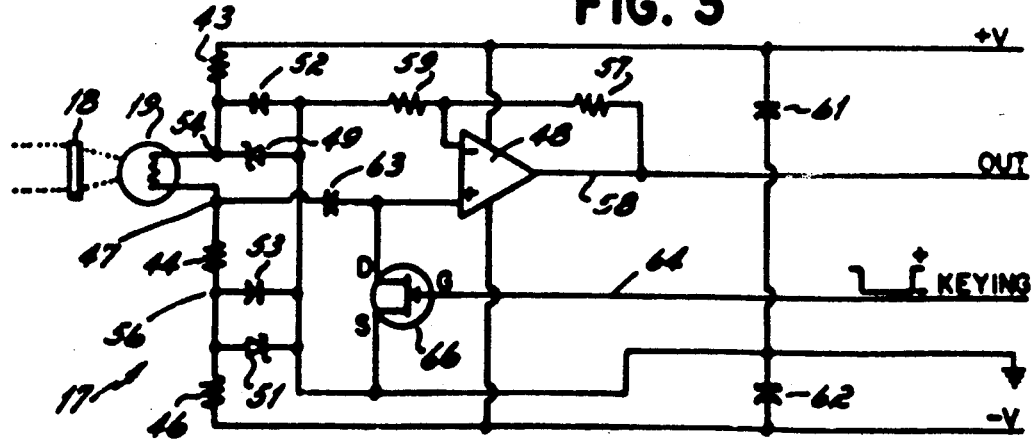
FIG. 4 is a schematic diagram of the bead detector circuitry of FIG. 2.

An adhesive bead detector wand 16, including bead detector circuitry 17 therein, is positioned slightly downstream from the dispenser 12, spaced apart from adhesive beads B which are dispensed onto the substrate S. The wand 16 includes in its end adjacent the beads B a flat Fresnel lens 18 which directs infrared radiation from the adhesive beads onto an infrared sensor 19 (FIG. 4). In its illustrated form, the sensor 19 is a lead selenide sensor sensitive to infrared radiation having wave lengths in the range between 1 and 4 micrometers. The resistance of the sensor 19 decreases as the level of radiation, in its band of sensitivity, increases.

The bead detector wand circuitry 17 is coupled by suitable electrical lines 21 to a comparator circuit 22. The comparator circuit 22 is operable to sound an alarm 23 if the infrared radiation from a heated adhesive bead sensed by the bead detector wand is outside an acceptable range, as shall be described. A pulse conditioning circuit 24 utilizes the pulses produced by the dispenser gun pulse generator 14 to provide keying, or enabling, signals to the bead detector circuitry 17, on a line 26, and to the comparator circuitry 22.

Figure 2:
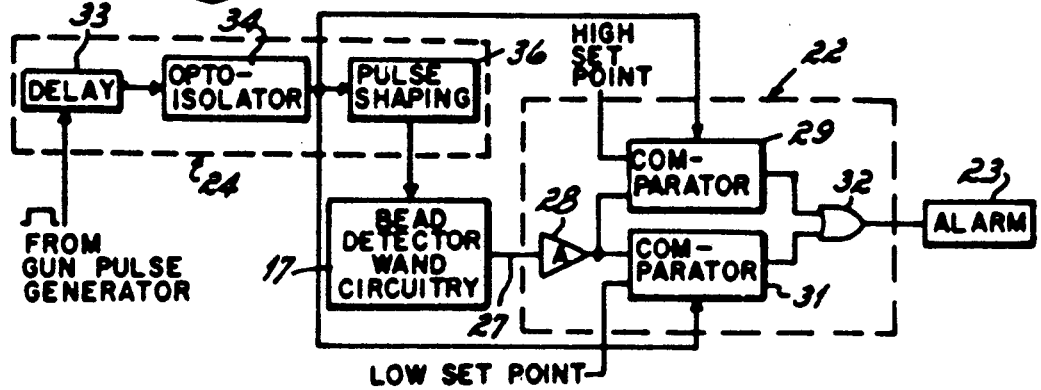
FIG. 2 is a more detailed diagrammatic illustration of the pulse conditioning and comparator circuits of FIG. 1.
Figure 3:
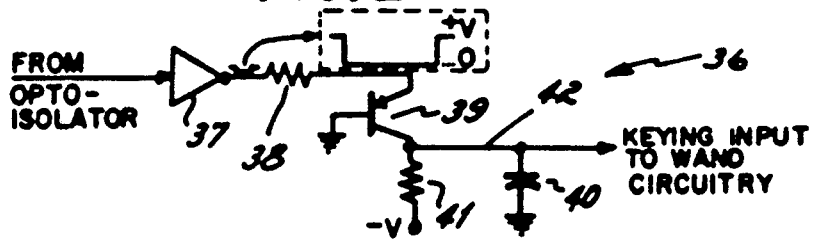
FIG. 3 is a circuit diagram of the pulse shaping portion of the pulse conditioning circuit of FIG. 2.

With particular reference to FIG. 2, the bead detector wand circuitry 17 produces an electrical output signal indicative of the level of infrared radiation received by the infrared sensor 19 at an output 27, which is coupled to the comparator circuit 22. In the comparator circuit 22 the output signal from the circuit 17 is amplified by a dc amplifier 28, the output of which is coupled to a comparator circuit 29 and a comparator circuit 31. The comparator 29 compares the output of the amplifier 28 with a high level set point value, and the comparator 31 compares the output of the amplifier 28 with a low level set point value. If the output of the amplifier 28 exceeds the high level set point value, or is less than the low level set point value, indicative of an out-of-range infrared radiation reading for an adhesive bead, the appropriate comparator produces an output signal which is coupled through an OR gate 32 to the alarm 23, sounding an alarm.

The bead detector circuitry 17 and the comparator circuits 29, 31 cooperate to monitor infrared radiation and produce an alarm in suitable circumstances only while a bead of adhesive is passing the bead detector wand 16. In order to do this, the pulse signal from the gun pulse generator 14 for driving the dispenser solenoid 13 is used, after suitable conditioning, to key, or enable the bead detector circuitry 17 and the comparator circuits.

The output pulses from the dispenser gun pulse generator circuit 14 are coupled to delay and scaling circuitry 33 in the pulse conditioning circuit 24. The circuitry 33 serves to scale the solenoid pulses to a suitable amplitude and, if necessary, to delay the pulses. As shall be described in more detail hereinafter, the bead detector wand circuitry 17 is typically keyed shortly before the arrival of a bead of adhesive in the infrared sensitive zone of the bead detector wand 16. The keying is provided by a keying pulse which persists until at or near the end of an adhesive bead. The keying pulse for the bead detector wand circuitry 17 is derived from the dispenser gun pulse produced by the gun pulse generator 14, and the scaling and delay circuitry 33 serves to delay the beginning or the end of the gun pulse, if necessary, in forming the keying pulse.

Since the sensor is positioned downstream from the dispensing gun, there is a delay between the time that the gun begins to dispense adhesive onto a substrate and the time that the beginning of the adhesive bead reaches the dispenser. In addition, there is a delay in the dispensing of adhesive from the gun 12 between the time that the leading edge of a gun pulse reaches the solenoid and the time at which adhesive actually begins to flow from the gun onto the substrate. In many cases the dispenser is positioned an appropriate distance downstream from the adhesive gun so that the keying pulse for the sensor may have a leading edge which occurs at the same time as the leading edge of the gun pulse. The sensor is then keyed shortly before the adhesive bead actually arrives at the sensor, which is the desired situation for the bead detector circuitry 17, as shall be described in detail hereinafter.

At the end of the dispensing of an adhesive bead onto a substrate, the gun pulse to the solenoid 13 for the dispensing gun 12 is terminated, producing a trailing edge of the pulse. The trailing edge of the keying pulse may coincide with the trailing edge of the gun pulse, in which case a relatively short length of the end of the bead is not monitored.

The scaling and delay circuitry 33 may include circuitry for delaying the trailing edge of the keying pulse slightly beyond the occurrence of the trailing edge of the gun pulse, if desired. The need to delay the trailing edge of the keying pulse would typically arise in a situation in which the sensor is positioned a considerable distance downstream from the dispensing gun. In such a situation, it may also be necessary to provide a delay for the leading edge of the keying pulse, relative to the leading edge of the gun pulse, to insure that the end of a previous bead of adhesive has passed the sensor before the bead detector circuitry receives the leading edge of a subsequent keying pulse.

The scaled and delayed pulses from the delay circuitry 32 are coupled to an opto-isolator 34, which isolates the dispenser pulse generating circuitry from the bead detection circuitry. The output of the opto-isolator 34 is coupled to a pulse shaping circuit 36, which produces keying pulses for the bead detector wand circuitry 17.

In the pulse shaping circuitry 36, the opto-isolator output pulses are inverted by an inverter 37 and coupled through a resistor 38 to the emitter of a transistor 39. The inverted pulses at the output of the inverter 37 are at a logic low, or zero potential, during the pulse interval, having been inverted by the inverter 37 from the positive pulses received from the opto-isolator 34.

The leading and trailing edges of the pulses from the inverter 37 are the same as the leading and trailing edges of the keying pulses to be supplied to the bead detector circuitry 17. In the illustrated bead detector circuitry 17, a keying pulse having a negative voltage level is required, as shall be described in more detail hereinafter. In order to obtain such a negative keying pulse, the pulse from the inverter 37 is level shifted by the resistor 38, the transistor 39, and a resistor 41 and capacitor 40.

The pulse from the inverter 37 is at a logic low, or zero potential, with the interval between pulses being at the positive supply voltage +V. In the level shifting circuitry, a negative supply voltage −V is coupled through the resistor 41 to the collector of the transistor 39. The pulse from the inverter 37 is coupled through the resistor 38 to the emitter of the transistor 39.

Between pulses, when the output of the inverter 37 is positive, the transistor 39 conducts. The resistor 41 is selected to be larger than the resistor 38, and therefore a positive voltage is provided on the line 42 connected to the collector of the transistor 39 during intervals between pulses when the transistor 39 is conductive.

The pulse voltage is level shifted by the level shifting circuitry from the zero potential at the output of the inverter 37 to a level approximately equal to the negative supply voltage −V. During a pulse interval, the voltage applied to the emitter of the transistor 39 drops to zero, the transistor becomes non-conductive, and the negative supply voltage −V is coupled through the resistor 41 to the line 42. This produces the desired negative-going keying pulse for the bead detector wand circuitry 17.

With reference now to FIG. 4, the bead detector wand circuitry 17 includes the sensor 19 connected in series with resistors 43, 44 and 46 to form a voltage divider between the positive supply voltage +V and the negative supply voltage −V. The resistors 43 and 46 are relatively small, and the resistor 44 has a resistance of the same general magnitude of the range of resistances of the sensor 19, dependent upon the temperature of the sensor and the amount of infrared radiation received by the sensor in the band of frequencies to which the sensor is sensitive. The bead detector wand circuitry 17 further includes a non-inverting operational amplifier circuit including an operational amplifier 48.

The voltage across the series connection of the sensor 19 and the resistor 44 is regulated by two zener diodes 49, 51, each of which has a noise suppression capacitor 52, 53 in parallel therewith. In one form of the detector wand circuitry, for example, a regulated +10 volt supply is provided at the node 54 and a regulated −10 volt supply is provided at the node 56 so that 20 volts are applied across the connection of the sensor 19 in series with the resistor 44. In this form of the bead detector circuitry 17, the resistor 44 is 330K ohms and the sensor 19 has a room temperature resistance in a range between 150 and 300K ohms, dependent upon the particular sensor device.

In the non-inverting amplifier configuration of the operational amplifier 48, a feedback resistor 57 is connected from the output 58 of the amplifier 48 to its inverting input. A resistor 59 is connected between the inverting input of the amplifier 48 and ground. To provide additional filtering for the supplies +V and −V, a capacitor 61 is connected between the supply +V and ground, and a capacitor 62 is connected between the supply −V and ground. The node 47 between the sensor 19 and the resistor 44 is capacitively coupled through a capacitor 63 to the non-inverting input of the operational amplifier 48.

In order to enable the bead detector circuitry 17 prior to a bead B of adhesive passing the bead detector wand 16, the keying output 42 from the pulse shaping circuitry 36 is coupled on a line 64 to the gate of a field effect transistor 66, which is coupled between the non-inverting input of the amplifier 48 and ground. The drain of the transistor 66 is connected to the non-inverting input of the amplifier 48 and the source of the transistor 66 is connected to ground. The field effect transistor (FET) 66 is an n-channel FET, and in the absence of a negative keying pulse on the line 64, the FET 66 is gated on by the positive voltage on the keying pulse line 64 which is connected to the gate of the FET. With the FET conductive, the non-inverting input to the amplifier 48 is clamped to ground, and the output 58 of the amplifier is zero.

Prior to the arrival of the beginning of an adhesive bead at the bead detector wand 16, the leading edge of a negative keying pulse arrives at the gate of the FET 66. This turns off the FET, and unclamps the non-inverting input of the amplifier 48 from ground. The capacitor 63 interposed between the non-inverting input of the amplifier 48 and the node 47 (connected to the sensor 19) is a relatively high value (such as 1.0 microfarad), low leakage, capacitor, and the voltage at the non-inverting input of the amplifier 48 remains at zero after unclamping while the sensor 19 receives a substantially constant level of infrared radiation from the substrate S before the arrival of the beginning of the next adhesive bead.

When the next adhesive bead reaches the bead detector wand 16, the infrared radiation, which is coupled to the sensor 19 from the heated adhesive, increases, and the resistance of the sensor 19 decreases. This decrease in the resistance of the sensor 19, results in an increase in voltage at the node 47, and this increase in voltage is coupled through the capacitor 63 to the non-inverting input of the amplifier 48. This increase in input voltage produces an amplified output signal on the output line 58, having a value dependent upon the voltage coupled to the non-inverting input of the amplifier. This input voltage is indicative of the difference between the infrared radiation emitted by the bead of heated adhesive and that emitted by the substrate. Since the duration of a typical adhesive bead is a matter of seconds, the temperature of the sensor is substantially the same (a) when the infrared radiation from the substrate is sensed and (b) for the period of time during which the subsequent bead of adhesive is monitored. Therefore, the voltage at the output 58 is, for all practical purposes, indicative of the infrared radiation of the adhesive bead uninfluenced by the sensor temperature.

When the trailing edge of the keying pulse arrives on the keying line 64, the FET 66 is again turned on, and the non-inverting input of the amplifier 48 clamped to ground.

The output 58 is an analog voltage signal which, as previously mentioned, is indicative of the temperature and size of the heated adhesive bead applied to a substrate, during the time that the bead detector circuitry 17 is receiving a keying pulse. Between keying pulses, the output of the amplifier 48 on the line 58 is at a zero level. Since the output 58 is coupled to the comparator circuit 22, and the individual comparator circuits 29 and 31 therein, for the purpose of determining whether an alarm condition exists, the comparator circuits 29 and 31 should be operable only during times at which the bead detector circuitry is keyed on. In order to do this, the non-inverted, and non-level shifted, keying pulses at the output of the opto-isolator 34 are coupled to each of the comparator circuits 29 and 31 to serve as enabling pulses. With regard to the low level comparator circuit 31, a small additional delay should be included therein before performing level comparisons for each adhesive bead in order to compensate for the time that the bead detector circuitry 17 is keyed on prior to the arrival of the beginning of the adhesive bead.

What is claimed is:

1. A system for monitoring energy radiant from a material dispensed onto a substrate comprising:
   a sensor positioned to receive radiant energy from a substrate and from a material dispensed onto the substrate, the sensor having an electrical characteristic whose value varies in part in dependence upon the amount of energy, in at least a given energy band, received by the sensor;
   amplifier means electrically connected to the sensor for producing an output signal which varies in dependence upon the value of said electrical characteristic of the sensor, the amplifier means including an amplifier (a) having an input capacitively coupled to the sensor and (b) producing said output signal at an output; and
   means for clamping the input of the amplifier to a particular voltage level when the sensor is receiving radiant energy from the substrate and for unclamping the input of the amplifier before the sensor receives radiant energy from material dispensed onto the substrate.

2. The system of claim 1 in which the means for clamping the input of the amplifier includes means for coupling the amplifier input to electrical ground.

3. The system of claim 2 in which the amplifier is a non-inverting operational amplifier having a non-inverting input which is capacitively coupled to the sensor.

4. The system of claim 3 in which the means for coupling the amplifier input to ground includes a field effect transistor.

5. The system of claim 4 in which the sensor is an infrared sensor.

6. A dispensing arrangement for dispensing a material onto a substrate comprising:
   dispensing means responsive to a dispenser control signal for dispensing a material onto a substrate;
   means for producing a dispenser control signal at an output which is coupled to the dispensing means;
   a sensor positioned near the dispensing means to receive radiant energy from a substrate and from material dispensed onto a substrate by the dispensing means, the sensor having an electrical characteristic whose value varies in part in dependence upon the amount of energy, in at least a given energy band, received by the sensor;
   amplifier means electrically connected to the sensor for producing an output signal which varies in dependence upon the value of said electrical characteristic of the sensor, the amplifier means including an amplifier (a) having an input capacitively coupled to the sensor and (b) producing said output signal at an output; and
   means, coupled to the means for producing a dispenser control signal, for clamping the input of the amplifier to a particular voltage level when the sensor is receiving radiant energy from a substrate and for unclamping the input of the amplifier before the sensor receives radiant energy from material dispensed onto a substrate.

7. The arrangement of claim 6 in which the sensor is an infrared sensor.

8. The arrangement of claim 7 in which the amplifier is a non-inverting operational amplifier having a non-inverting input which is capacitively coupled to the sensor.

9. The arrangement of claim 8 in which the means for clamping the amplifier input to a particular voltage level includes a field effect transistor.

10. The arrangement of claim 9 which further comprises means, coupled to the output of the amplifier, for comparing said output signal to high and low set point values when the sensor is receiving radiant energy from material dispensed on a substrate and for producing an alarm if said output signal falls outside of a range of values between said set points.

11. A system for monitoring energy radiant from a material dispensed onto a substrate comprising:
    a sensor positioned to receive radiant energy from a substrate and from a material dispensed onto the substrate, the sensor having an electrical characteristic whose value varies in part in dependence upon the amount of energy, in at least a given energy band, received by the sensor;
    amplifier means electrically connected to the sensor for producing an output signal which varies in dependence upon the value of said electrical characteristic of the sensor, the amplifier means including an amplifier (a) having an input coupled to the sensor and (b) producing said output signal at an output;
    means, coupled to the sensor and responsive to the value of said electrical characteristic of the sensor when the sensor is receiving radiant energy from the substrate, for coupling to the amplifier input a sensor signal representative of the difference between (a) the value of said electrical characteristic of the sensor when the sensor is receiving radiant energy from material dispensed onto the substrate and (b) the value of said electrical characteristic of the sensor when the sensor is receiving radiant energy from the substrate; and keying means for coupling a keying signal to the means for coupling when the sensor is receiving radiant energy from the substrate so that the means for coupling is responsive to the value of said electrical characteristic of the sensor when the sensor is receiving radiant energy from the substrate.

12. A system for monitoring energy radiant from a material dispensed onto a substrate comprising:

a sensor positioned to receive radiant energy from a substrate and from a material dispensed onto the substrate, the sensor having an electrical characteristic whose value varies in part in dependence upon the amount of energy, in at least a given energy band, received by the sensor;

means, coupled to the sensor and responsive to the value of said electrical characteristic of the sensor when the sensor is receiving radiant energy from the substrate, for producing a sensor signal representative of the difference between (a) the value of said electrical characteristic of the sensor when the sensor is receiving radiant energy from material dispensed onto the substrate and (b) the value of said electrical characteristic of the sensor when the sensor is receiving radiant energy from the substrate; and means for clamping the sensor signal to a particular level when the sensor is receiving radiant energy from the substrate and for unclamping the sensor signal before the sensor receives radiant energy from material dispensed onto the substrate.

13. The system of claim 12 in which the sensor is an infrared sensor and said electrical characteristic also varies in dependence upon the temperature of the sensor.

14. A system for monitoring energy radiant from a material dispensed onto a substrate comprising:

sensor means for receiving radiant energy from a substrate and from a material dispensed onto the substrate, the sensor means having an output providing a signal correlated to the amount of energy, in at least a given energy band, received by the sensor means;

amplifier means, having an input for producing an output signal at an output corresponding to a signal at the input of the amplifier means;

a capacitor connected between the output of the sensor means and the input of the amplifier means; and means for clamping the input of the amplifier means to a particular voltage level when the sensor means is receiving radiant energy from the substrate and for unclamping the input of the amplifier before the sensor means receives radiant energy from material dispensed onto the substrate.

15. The system of claim 14 in which the capacitor has at least two terminals, one terminal being connected directly to the output of the sensor means and another terminal being directly connected to the input of the amplifier means.

16. A dispensing arrangement for dispensing a material onto a substrate comprising:

dispensing means responsive to a dispenser control signal for dispensing a material onto a substrate;

means for producing a dispenser control signal at an output which is coupled to the dispensing means;

sensor means, positioned near the dispensing means, for receiving radiant energy from a substrate and from material dispensed onto a substrate by the dispensing means, the sensor means having an output providing a signal correlated to the amount of energy, in at least a given energy band, received by the sensor means;

amplifier means, having an input, for producing an output signal at an output corresponding to a signal at the input of the amplifier means;

a capacitor connected between the output of the sensor means and the input of the amplifier means; and means, coupled to the means for producing a dispenser control signal, for clamping the input of the amplifier means to a particular voltage level when the sensor means is receiving radiant energy from a substrate and for unclamping the input of the amplifier means before the sensor means receives radiant energy from material dispensed onto a substrate.

17. The arrangement of claim 16 which further comprises means, coupled to the output of the amplifier means, for comparing said output signal to high and low set point values when the sensor means is receiving radiant energy from material dispensed on a substrate and for producing an alarm if said output signal falls outside of a range of values between said set points.

18. The arrangement of claim 17 in which the capacitor has at least two terminals, one terminal being connected directly to the output of the sensor means and another terminal being directly connected to the input of the amplifier means.

19. A system for monitoring energy radiant from a material dispensed unto a substrate comprising:

sensor means for receiving radiant energy from a substrate and from a material dispensed onto the substrate, the sensor means having an output providing a signal correlated to the amount of energy, in at least a given energy band, received by the sensor means;

amplifier means, having an input, for producing an output signal at an output corresponding to a signal at the input of the amplifier means;

coupling means, responsive to the value of said electrical characteristic of the sensor when the sensor means is receiving radiant energy from the substrate, for coupling to the input of the amplifier means a sensor signal representative of the difference between (a) the signal provided at said output of the sensor means when the sensor means is receiving radiant energy from material dispensed onto the substrate and (b) the signal provided at said output of the sensor means when the sensor means is receiving radiant energy from the substrate; and means for clamping the input of the amplifier means to a particular level when the sensor means is receiving radiant energy from the substrate and for unclamping the input of the amplifier before the sensor means receives radiant energy from material dispensed onto the substrate.

20. The system of claim 19 in which the coupling means includes a capacitor connected between the output of the sensor means and the input of the amplifier means.

21. The system of claim 20 in which the capacitor has at least two terminals, one terminal being connected directly to the output of the sensor means and another terminal being directly connected to the input of the amplifier means.

22. The system of claim 20 which further comprises keying means for coupling a keying signal to the clamping means when the sensor means is receiving radiant energy from the substrate so that the amplifier means is responsive to the signal provided at said output of the sensor means when the sensor means is receiving radiant energy from the substrate.

23. The system of claim 22 in which the capacitor has at least two terminals, one terminal being connected directly to the output of the sensor means and another terminal being directly connected to the input-of the amplifier means.

* * * * *